United States Patent [19]

Stover et al.

[11] Patent Number: 5,318,181

[45] Date of Patent: Jun. 7, 1994

[54] COMPARTMENTALIZED HUMIDITY SENSING INDICATOR

[75] Inventors: Mary M. Stover; Robert D. Gerke, both of Austin, Tex.

[73] Assignee: Motorola, Inc., Schaumburg, Ill.

[21] Appl. No.: 860,848

[22] Filed: Mar. 31, 1992

[51] Int. Cl.⁵ .................... B65D 73/02; B65D 81/26
[52] U.S. Cl. .................... 206/459.1; 206/204; 206/330; 206/332
[58] Field of Search ............. 206/204, 330, 332, 459.1

[56] References Cited

U.S. PATENT DOCUMENTS

4,971,196 11/1990 Kitamura et al. ............... 206/204 X

FOREIGN PATENT DOCUMENTS

045368 2/1990 Japan .................... 206/330

*Primary Examiner*—William I. Price
*Attorney, Agent, or Firm*—Minh-Hien N. Clark

[57] ABSTRACT

Plastic encapsulated ICs (28) are susceptible to moisture due to the permeability of molding compounds. ICs (28) may be baked until dry before being shipped to the customer to reduce the risk of cracking. To retain this dry condition, ICs (28) are packaged and shipped in dry-packs. Compartmentalized humidity sensing indicators (14, 16 and 18) are provided for tape and reel IC shipping medium (20) to monitor moisture levels. The indicators (14, 16 and 18) are provided at multiple locations along the carrier tape (22) as a continuous strip with repeating series of humidity indicators. Distinction can be made between the humidity conditions along the length of the carrier tape, which allows identification of problem areas and affected devices. Thus, only portions of devices shipped in tape and reel need rebaking, which offers cycle time and cost advantages over rebaking the entire contents of the carrier tape. Compartmentalized indicators (14, 16 and 18) can also be applied to other IC shipping media such as rails (32) and trays (42).

19 Claims, 3 Drawing Sheets

COMPARTMENTALIZED HUMIDITY SENSING INDICATOR

CROSS-REFERENCE TO RELATED APPLICATION

Related subject matter is disclosed in U.S. Patent application Ser. No. 07/860,870 by Robert David Gerke et al., entitled "Individualized Desiccant," filed concurrently herewith and assigned to the assignee hereof.

FIELD OF THE INVENTION

The present invention relates to the packaging for shipping of integrated circuits in general, and more specifically to humidity sensing indicators that are included with each batch shipment of plastic encapsulated ICs.

BACKGROUND OF THE INVENTION

Plastic encapsulated semiconductor devices are susceptible to moisture ingress due to the permeable nature of plastic molding compounds. The amount of moisture that a plastic IC absorbs from its environment is dependent on several factors: the length of exposure time to the environment, the diffusivity of the plastic or how quickly moisture can be absorbed into the material, the solubility coefficient of the plastic or its saturation capacity, and the thickness of the plastic body on the IC. Devices containing moisture levels exceeding some critical amount run the risk of cracking or "popcorning" during the rapid heating of the solder reflow operation. Semiconductor devices which are subject to cracking are normally baked in an oven at approximately 125° C., a typical temperature, for a predetermined length of time to drive moisture out of the devices before they are shipped to the customer. Those devices that are deemed to be moisture sensitive are packaged in "dry-packs" after baking to ensure that they are protected from moisture thereafter and will arrive dry at the customer site. Otherwise, devices that have absorbed a certain level of moisture run the risk of cracking during the solder reflow operation. Mechanical failure of the ICs often times lead to subsequent electrical failure of these same devices due to thermal and mechanical stresses induced on the ICs during their operation.

Current dry-packing practices involve baking semiconductor devices until dry, placing them into a dry-pack bag with desiccant packets and a humidity indicator card, sealing the bag immediately thereafter, and shipping the devices to the customer in these dry-packs. The amount of desiccant in each dry-pack bag can be determined by using IPC Standard SM786. A problem with the current method of dry-packing is that desiccant packets may not keep the dry-pack bag uniformly dry. Therefore, a single humidity indicator card is insufficient to give a true history of the conditions inside the dry-pack bag. The humidity indicator card is only accurate for a single site inside the bag. Furthermore, the location of the humidity indicator card relative to the desiccant also affects the amount of moisture that it senses, hence its accuracy. If the card is too close to the desiccant, then it will sense a drier atmosphere than if it were far away from the desiccant. It is impossible to accurately gauge how much moisture each IC has been exposed to.

SUMMARY OF THE INVENTION

In accordance with the invention, there is provided an integrated circuit (IC) packaging medium having a shipping means for carrying ICs, a cover, and a plurality of humidity sensing indicators. The shipping means for carrying ICs has a plurality of compartments wherein the ICs are contained. The cover contains the ICs within the shipping means. The plurality of humidity sensing indicators is placed in close proximity to the ICs contained inside the compartments of the shipping means and is located between the shipping means and the cover wherein each of the plurality of humidity sensing indicators monitors a small groups of the ICs. These and other features, and advantages, will be more clearly understood from the following detailed description taken in conjunction with the accompanying drawings. It is important to point out that the illustrations may not necessarily be drawn to scale, and that there may be other embodiments of the present invention which are not specifically illustrated.

DETAILED DESCRIPTION OF A PREFERRED EMBODIMENT

Figure 1:
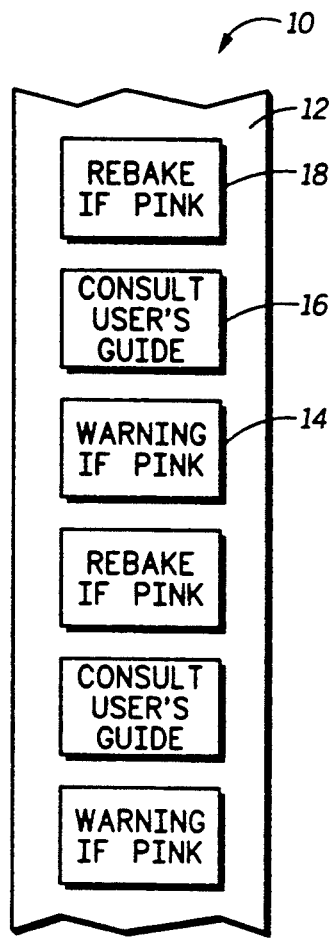
FIG. 1 is a top view of a section of a strip of humidity sensing indicators, in accordance with the present invention.

With the present invention, it is possible to meet the previously stated desired feature of accurately gauging how much exposure a semiconductor device has had to moisture. The invention enables a color change humidity sensing indicator to be incorporated into an IC packaging medium. In accordance with the invention, shown in FIG. 1 is a section 10 of a strip of humidity sensing indicators comprising a strip 12 with repeating series of humidity sensing indicators 14, 16 and 18. The material used for the indicators can be of any conventionally available material, but it is important to select indicator materials that do not act as contaminants to ICs. Typically blue in color, humidity sensing indicator 14 changes to a pink color when it senses a relative humidity of 20% or greater. Manufacturers normally guarantee a maximum relative humidity of 30% for dry-pack conditions, which is typically considered a safe moisture level for board mounting of most plastic encapsulated semiconductor devices. Therefore, humidity sensing indicator 16 changes to a pink color when it senses a relative humidity of 30% or greater. Indicator 16 tells the user to exercise caution when this condition exists and that the user's guide need to be consulted before surface mounting of the plastic encapsulated ICs. When relative humidity conditions reach or exceed 40%, humidity sensing indicator 18 changes to a pink color. Indicator 18, when activated, tells the user to rebake the plastic encapsulated semiconductor devices before surface mounting.

Figure 2:
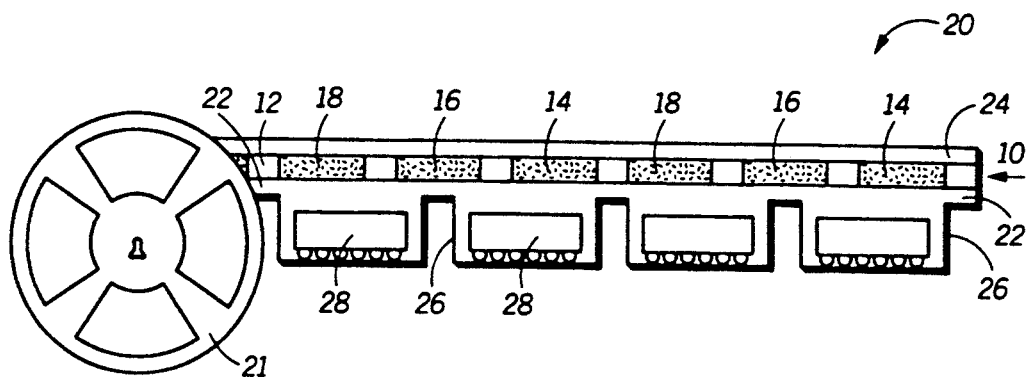
FIG. 2 is a cross-sectional view of a portion of a tape carrier, illustrating an embodiment of the present invention.

A cross-sectional view of tape and reel packaging 20 for semiconductor devices is illustrated in FIG. 2, an embodiment of the present invention. Shown in FIG. 2 is a reel 21 and a portion of a carrier tape 22 with a cover tape 24 wherein the section 10 is placed between carrier tape 22 and cover tape 24. Carrier tape 22 has a plurality of individualized compartments 26 for carrying ICs. Semiconductor devices 28, illustrated in FIG. 2 as plastic pad array carriers, are shown inside the compartments 26. The humidity sensing indicator strip 12, which contains a repeating series of humidity indicators 14, 16 and 18, is located above carrier tape 22. The width of strip 12 is cut to match the width of the carrier tape 22 and cover tape 24. The humidity sensing indicators 14, 16 and 18 are sized and spaced such that every two compartments 26 are covered by a series of indicators. The advantage to having only two compartments per series of indicators is the localized measurement of relative humidity. Therefore, an accurate moisture exposure history is recorded for each IC, thus allowing a selective rebaking of devices. In effect, rebake before mounting of all semiconductor devices can be reduced to rebake of only those devices that have had excessive exposure to moisture. In practice, the number of compartments covered by a series of indicators can vary per application. For example, if the compartments are large, then each compartment can be covered by a series of indicators; or conversely, if the compartments are small, then more than two compartments can be covered by a series of indicators. The advantage to the present invention is still preserved because localized indicators gauge moisture levels more accurately for those locales than a single humidity indicator for an entire dry-pack bag.

Figure 3:
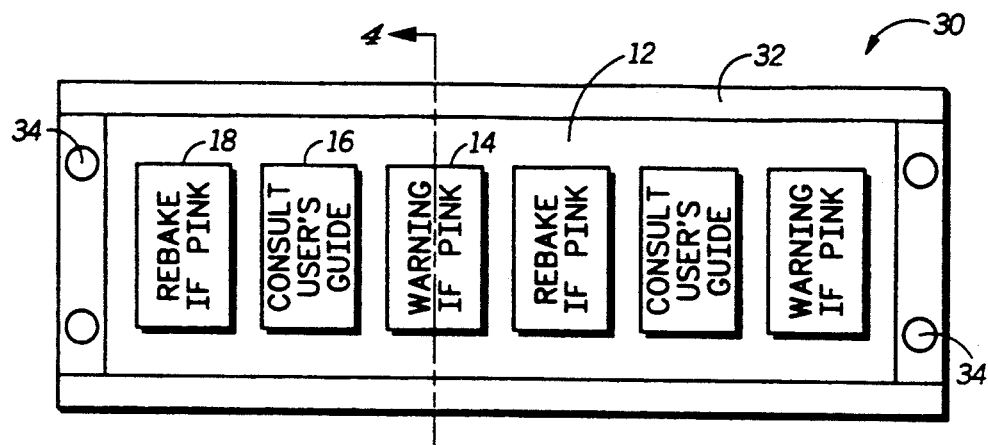
FIG. 3 is a top view of a rail for carrying ICs with a continuous strip of humidity sensing indicators, illustrating a second embodiment of the invention.

As an alternative embodiment of the invention, another IC packaging medium 30 is illustrated in FIG. 3. A strip 12 having a repeating series of humidity sensing indicators 14, 16 and 18, is incorporated into a rail 32, which has a clear window for the user to view the inside of rail 32. Stoppers 34 prevent ICs, which are not seen from the top view, from sliding out of the rail 32. The strip 12 extends the length of the rail 32 between the opposing stoppers 34. Since a typical shipping rail is approximately 45 cm to 60 cm, humidity levels inside the rail may not be significantly different from one end of the rail to the other, so a short strip comprising only one series of humidity sensing indicators may be sufficient. The important element is that each rail should have a set of humidity sensing indicators because a plurality of rails are shipped inside a single dry-pack bag. Thus, the moisture exposure history for each rail is recorded accurately by having individualized humidity indicators per rail.

Figure 4:
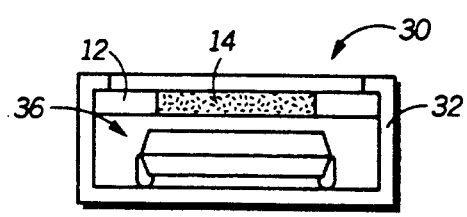
FIG. 4 is a cross-sectional view of the rail and the humidity indicating strip shown in FIG. 3.

FIG. 4 is a cross-sectional view along line 4—4 (in FIG. 3) of IC packaging medium 30. Shown in FIG. 4 is a representative J-leaded semiconductor device 36 inside rail 32 with humidity sensing indicator 14 above device 36. The lengthwise cross-sectional view of rail 30 is not shown because the concept is very similar to that of the tape and reel packaging illustrated in FIG. 2.

Figure 5:
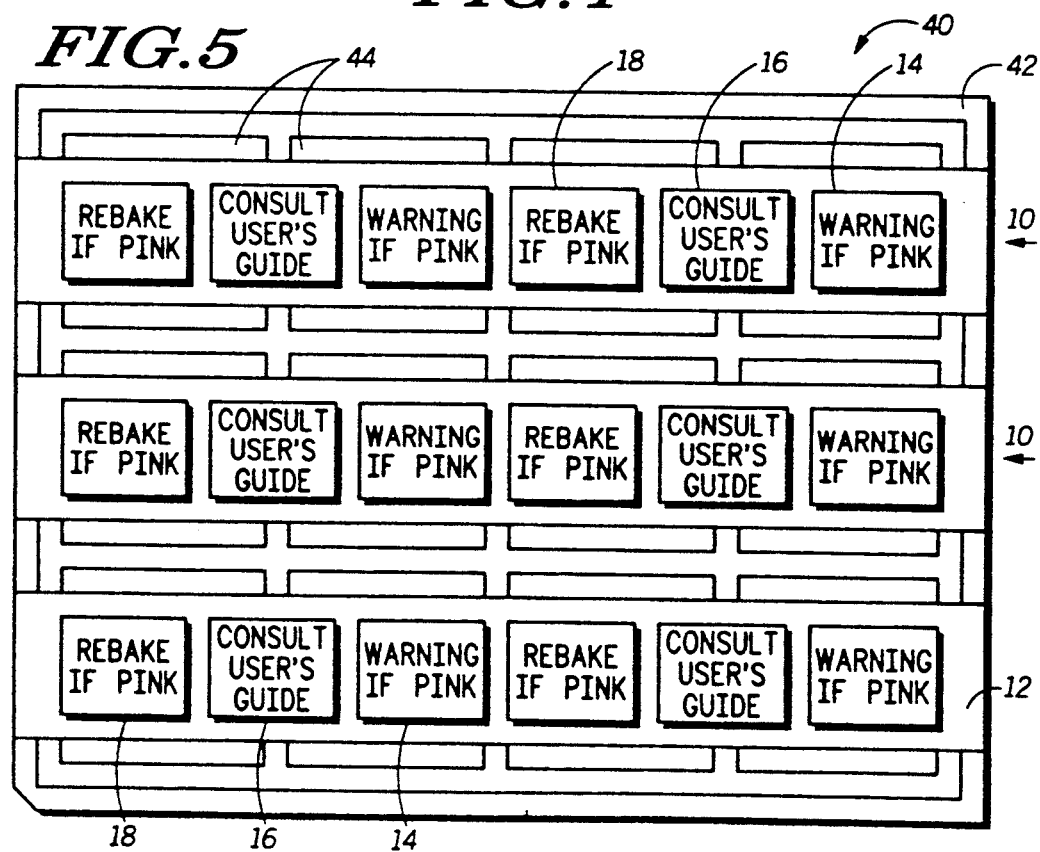
FIG. 5 is a top view of a tray for carrying ICs with a plurality of continuous strips of humidity sensing indicators, illustrating a third embodiment of the invention.

Yet another IC packaging medium 40 is illustrated in FIG. 5 as an alternative embodiment of the present invention. A tray 42 has an array of pockets 44 for carrying ICs. A strip 12 having a repeating series of humidity sensing indicators 14, 16 and 18, is present for each row of semiconductor devices on the tray 42. The individualized strips allow for localized monitoring of moisture exposure on each tray. Devices shipped in trays typically have another tray or trays filled with ICs, stacked on top of each other, the top tray being empty and used as a lid. Therefore, it is easy to incorporate humidity sensing indicator strips into tray packaging because the strips can be held in place by the upper tray.

Figure 6:
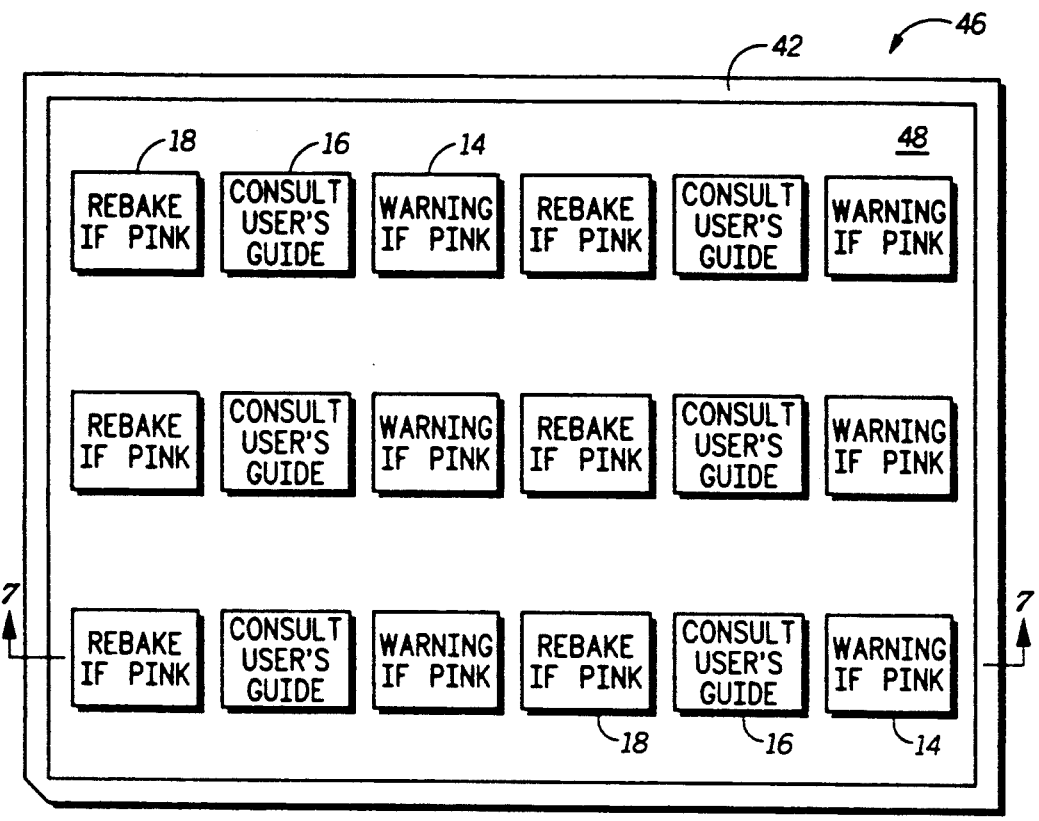
FIG. 6 is a top view of a tray for carrying ICs with a sheet of humidity sensing indicators, illustrating a fourth embodiment of the present invention.

As a variation to packaging method 40, IC packaging method 46 is illustrated in FIG. 6. A sheet 48 having an array of humidity sensing indicators 14, 16 and 18, covers tray 42. The concept is the same as that which was shown in FIG. 5 except that a single whole sheet is employed in lieu of a plurality of individualized strips. The advantage of localized monitoring of moisture levels is retained.

Figure 7:
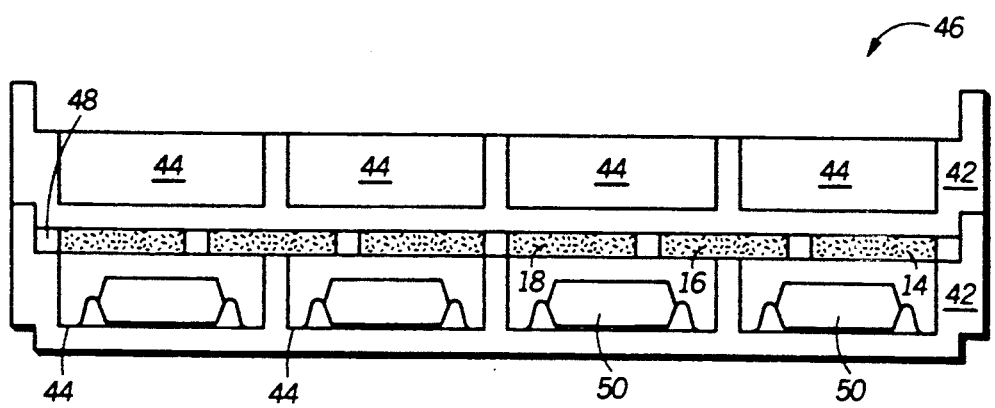
FIG. 7 is a cross-sectional view of the tray for carrying ICs with a sheet of humidity sensing indicators as shown in FIG. 6.

Shown in FIG. 7 is a cross-section 46 along line 7—7 (in FIG. 6) of two trays 42 stacked on top of each other with sheet 48 located between the trays. A cross-section of a tray with strips of humidity sensing indicators such as strip 12 of FIG. 1, looks substantially the same as a cross-section of a tray with a sheet of humidity sensing indicators, shown in FIG. 7. The lower tray 42 is populated with representative gull-wing-leaded semiconductor devices 50. The humidity sensing indicators 14, 16 and 18, are located above the ICs 50. Only two trays are shown in FIG. 7 with the top tray being used as a lid. It should be noted, however, that a plurality of trays can be stacked on top of one another. The humidity sensing indicators can be placed between the stacking trays.

The foregoing description and illustrations contained herein demonstrate the advantages associated with the present invention. In particular, it has been revealed that the invention is easily adaptable to fit varying IC shipping media, such as tape and reel, rails and trays. The width and length of the humidity sensing indicator strip can easily be manufactured to fit different sizes of carrier tape, rails and trays. Moreover, only minor modifications to existing designs of tape and reel, rails, and trays are required to incorporate the present invention into the packaging of ICs.

Thus it is apparent that there has been provided, in accordance with the invention, a compartmentalized humidity sensing indicator that fully meets the need and advantages set forth previously. Although the invention has been described and illustrated with reference to specific embodiments thereof, it is not intended that the invention be limited to these illustrative embodiments. For example, each of the IC shipping media disclosed is suited for carrying semiconductor devices of different package configurations, in addition to the representative devices illustrated in the figures. Those skilled in the art will recognize that modifications and variations can be made without departing from the spirit of the invention. Therefore, it is intended that this invention encompass all such variations and modifications as fall within the scope of the appended claims.

We claim:

1. An integrated circuit (IC) packaging medium comprising:
   a shipping means for carrying ICs having a space wherein the ICs are contained;
   a retaining means for containing the ICs within the shipping means; and a plurality of humidity sensing indicators placed in close proximity to the ICs contained inside the space of the shipping means, the plurality of humidity sensing indicators being located within an area defined and constrained by the shipping means and the retaining means, wherein each of the plurality of humidity sensing indicators monitors a small group of the ICs.

2. The IC packaging medium according to claim 1 wherein the plurality of humidity sensing indicators comprises a contnuous strip having a repeating series of humidity indicators.

3. The IC packaging medium according to claim 1 wherein the plurality of humidity sensing indicators comprises a sheet having an array of a repeating series of humidity indicators.

4. The IC packaging medium according to claim 1 wherein the shipping means for carrying ICs comprises a carrier tape.

5. The IC packaging medium according to claim 1 wherein the shipping means for carrying ICs comprises a shipping tray.

6. An IC packaging medium comprising:
a carrier tape having a plurality of compartments in series for carrying ICs, the carrier tape extending for at least a first length;
a cover tape for sealing the ICs inside the carrier tape, the cover tape extending for at least the first length; and
a continuous strip having a plurality of humidity sensing indicators wherein the continuous strip extends for at least the first length and is placed in close proximity to the ICs contained inside the carrier tape.

7. The IC packaging medium according to claim 6 wherein the continuous strip of humidity sensing indicators is located between the carrier tape and the cover tape.

8. An IC packaging medium comprising:
a rail for carrying ICs, the rail extending for a first length;
a strip extending for at least the first length, the strip having a plurality of humidity sensing indicators wherein the strip is placed inside the rail in close proximity to the ICs contained inside the rail; and
a plurality of stoppers to contain the ICs within the rail.

9. An IC packaging medium comprising:
a tray having an array of compartments for carrying ICs;
a plurality of humidity sensing indicators placed in close proximity to the ICs contained inside the tray; and
a cover for the tray to contain the ICs within the compartments wherein the plurality of humidity sensing indicators is located between the tray and the cover.

10. The IC packaging medium according to claim 9 wherein the plurality of humidity sensing indicators comprises a plurality of strips.

11. The IC packaging medium according to claim 8 wherein the plurality of humidity sensing indicators comprises a sheet having an array of humidity sensing indicators.

12. The IC packaging medium according to claim 1 wherein the shipping means for carrying ICs comprises a shipping rail.

13. An IC packaging medium comprising:
a shipping means for carrying ICs having a space wherein the ICs are contained;
a retaining means for containing the ICs within the shipping means; and
a continuous strip having a repeating series of humidity sensing indicators which include at least two humidity sensing indicators specifying different humidity exposure conditions, the continuous strip being placed in close proximity to the ICs contained inside the space of the shipping means, the continuous strip being located within an area defined and constrained by the shipping means and the retaining means, wherein each humidity sensing indicator on the continuous strip monitors a small group of the ICs.

14. The IC packaging medium according to claim 6 wherein the plurality of humidity sensing indicators on the continuous strip comprises a repeating series of humidity indicators.

15. An IC packaging medium comprising:
a carrier tape having a plurality of compartments in series for carrying ICs, the carrier tape extending for at least a first length;
a cover tape for sealing the ICs inside the carrier tape, the cover tape extending for at least the first length; and
a continuous strip having a repeating series of humidity sensing indicators which include at least two humidity sensing indicators specifying different humidity exposure conditions, wherein the continuous strip extends for at least the first length and is placed in close proximity to the ICs contained inside the carrier tape.

16. The IC packaging medium according to claim 8 wherein the plurality of humidity sensing indicators on the continuous strip comprises a repeating series of humidity indicators.

17. The IC packaging medium according to claim 16 wherein the repeating series of humidity indicators comprises at least two humidity indicators specifying different humidity exposure conditions.

18. The IC packaging medium according to claim 10 wherein the plurality of strips each comprises at least one repeating series of humidity indicators.

19. The IC packaging medium according to claim 18 wherein the repeating series of humidity indicators comprises at least two humidity indicators specifying different humidity exposure conditions.

* * * * *